United States Patent
Tesson et al.

(10) Patent No.: US 9,136,061 B2
(45) Date of Patent: Sep. 15, 2015

(54) INTEGRATED CIRCUIT BASED VARACTOR

(71) Applicant: NXP B.V., Eindhoven (NL)

(72) Inventors: Olivier Tesson, Bretteville l'Orgueilleuse (FR); Laure Rolland du Roscoat, Caen (FR)

(73) Assignee: NXP, B.V., Eindhoven (NL)

( * ) Notice: Subject to any disclaimer, the term of this patent is extended or adjusted under 35 U.S.C. 154(b) by 136 days.

(21) Appl. No.: 13/953,539

(22) Filed: Jul. 29, 2013

(65) Prior Publication Data
US 2014/0036406 A1 Feb. 6, 2014

(30) Foreign Application Priority Data
Jul. 31, 2012 (EP) .................................. 12290264

(51) Int. Cl.
| | | |
|---|---|---|
| H01L 29/93 | (2006.01) | |
| H01G 7/06 | (2006.01) | |
| H01L 27/08 | (2006.01) | |
| H01L 23/482 | (2006.01) | |
| H01L 29/66 | (2006.01) | |
| H01L 27/02 | (2006.01) | |
| H01L 49/02 | (2006.01) | |

(52) U.S. Cl.
CPC ............. *H01G 7/06* (2013.01); *H01L 23/4824* (2013.01); *H01L 27/0808* (2013.01); *H01L 27/0811* (2013.01); *H01L 29/66174* (2013.01); *H01L 29/93* (2013.01); *H01L 27/0207* (2013.01); *H01L 28/86* (2013.01); *H01L 2924/0002* (2013.01)

(58) Field of Classification Search
USPC .......... 257/E27.049, E21.364, 312, 532, 595; 331/181
See application file for complete search history.

(56) References Cited

U.S. PATENT DOCUMENTS

| | | |
|---|---|---|
| 2003/0052389 A1 | 3/2003 | Maeda et al. |
| 2006/0214264 A1 | 9/2006 | Sze et al. |
| 2008/0180187 A1 | 7/2008 | Kinget et al. |
| 2010/0244113 A1 | 9/2010 | Rieh et al. |

OTHER PUBLICATIONS

Morandini, Y. et al. "High Frequency Characterization of Compact N+Poly/Nwell Varactor using Waffle-Layout", IEEE Topical Meeting on Silicon Monolithic Integrated Circuits in RF Systems, pp. 167-170 (Jan. 2008).

Kim, N. et al. "A 47 GHz *LC* Cross-Coupled VCO Employing High-*Q* Island-Gate Varactor for Phase Noise Reduction", IEEE Microwave and Wireless Components Letters, vol. 20, No. 2, pp. 94-96 (Feb. 2010).

Oh, Y. et al. "The Island-Gate Varactor-A High-Q MOS Varactor for Milimeter-Wave Applications", IEEE Microwave and Wireless Components Letters, vol. 19, No. 4, pp. 215-217 (Apr. 2009).

Extended European Search Report for Patent Appln. No. 12290264.6 (Dec. 7, 2012).

*Primary Examiner* — Chuong A Luu
*Assistant Examiner* — Cory Eskridge

(57) ABSTRACT

A varactor comprises a substrate having sets of gate units each having parallel gate strips. The gate units are located such that the gate strips of neighboring gate units are oriented transverse to each other. An electrically conducting gate connection layer comprises gate connection units comprising parallel gate connection strips located over the gate strips, and a cathode connection frame around each of the gate connection units. A first electrically conductive anode layer comprises first layer anode strips located parallel to the gate connection strips and connected to alternate gate connection strips, and a first anode connection frame connected to the anode strips. A second electrically conductive anode layer comprises anode strips located parallel to the gate connection strips and connected to opposite alternate gate connection strips, and a second anode connection frame connected to the second layer anode strips.

12 Claims, 11 Drawing Sheets

INTEGRATED CIRCUIT BASED VARACTOR

CROSS-REFERENCE TO RELATED APPLICATIONS

This application claims the priority under 35 U.S.C. §119 of European patent application no. 12290264.6, filed on Jul. 31, 2012, the contents of which are incorporated by reference herein.

The present disclosure relates to the field of integrated circuit based varactors.

Varactors, including integrated circuit based varactors, may be used in radio frequency (RF) voltage controlled oscillators (VCO), and in other oscillators. Improving the quality factor of a varactor in such a circuit can improve the performance of the circuit.

Typically in designing and realising a varactor, there is a trade-off between the quality factor which may be obtained and the tuning range. An improvement in the quality factor is often accompanied by a reduction of the tuning range. It is also a challenge in varactor design to obtain an acceptable quality factor while the varactor is operating in the $K_u$, K and $K_a$ frequency bands for millimeter wave operations.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

According to a first aspect of the invention, there is provided an integrated circuit based varactor comprising:
 a) a substrate comprising a set of first gate units and a set of second gate units, the sets of first and second gate units each comprising a plurality of substantially parallel gate strips, the sets of first and second gate units located such that the gate strips of the set of first gate units are oriented transverse to the gate strips of the set of second gate units;
 b) an electrically conducting gate connection layer comprising:
  a set of first gate connection units and a set of second gate connection units, each of the sets of first and second gate connection units comprising a plurality of substantially parallel gate connection strips; wherein the gate connection strips of the set of first gate connection units and the gate connection strips of the set of second gate connection units are located substantially over the gate strips of the sets of first and second gate units; and
  a cathode connection frame located around each of the gate connection units;
 c) a first electrically conductive anode layer comprising:
  one or more first anode strips located substantially parallel to the gate connection strips of the set of first gate connection units;
  one or more second anode strips located substantially parallel to the gate connection strips of the set of second gate connection units;
   each first anode strip connected to alternate gate connection strips of the set of first gate connection units, and alternate gate connection strips of the set of second gate connection units;
   each second anode strip connected to the alternate gate connection strips of the set of second gate connection units and the alternate gate connection strips of the set of first gate connection units; and
  a first anode connection frame connected to the one or more first anode strips and the one or more second anode strips;
 d) a second electrically conductive anode layer comprising:
  one or more first anode strips located substantially parallel to the gate connection strips of the set of first gate connection units;
  one or more second anode strips located substantially parallel to the gate connection strips of the set of second gate connection units;
   each first anode strip connected to opposite alternate gate connection strips of the set of first gate connection units, and opposite alternate gate connection strips of the set of second gate connection units;
   each second anode strip connected to opposite alternate gate connection strips of the set of second gate connection units, and opposite alternate gate connection strips of the set of first gate connection units; and
  a second anode connection frame connected to the one or more first anode strips and the one or more second anode strips.

Thus the varactor comprises a series of gate units in a gate layer, each gate unit comprising substantially parallel strips. The gate units are arranged so that neighbouring units have strips oriented transverse to each other. The transverse orientation of gate strips in neighbouring gate units (as opposed to, for example, a parallel orientation only of gate strips in the varactor) provides advantages such as an improved quality factor while maintaining a wide tuning range. The quality factor can be doubled compared with prior at devices. It is possible to tune varactors as disclosed herein for $K_u$, K and $K_a$ frequency band operation. Having a plurality of parallel anode strips together with connections between the parallel strips causes interactions which act to increase the parasitic capacitance for the varactor. By 'breaking' the parallel strips into smaller sub-units of strips and positioning the sub-units such that neighbouring sets of strips are transverse to each other, the parasitic capacitance can be advantageously reduced.

Gate connection strips in a gate connection layer are located over strips in the gate units. These gate connection strips may be imagined to fall into two sets, for example, "even" and "odd". The alternate "even" gate connection strips are connected to anode strips in a first anode layer located above the gate connection later. The anode strips in the first anode layer can be connected to the first anode connection frame at the periphery of the varactor in the first anode layer. The oppositely alternate "odd" gate connection strips are connected to anode strips in a second anode layer which may be located above the first anode layer. The anode strips in the second anode layer can be connected at to the second anode connection frame at the periphery of the varactor in the second anode layer.

The plurality of substantially parallel gate strips of the set of first gate units and the plurality of substantially parallel gate strips of the set of second gate units may comprise metal plates laid down over an oxide or other insulator on the substrate.

The cathode connection frame may be connected to the substrate by one or more vertical connectors.

The opposite alternate gate connection strips of the sets of first and second gate connection units, which are connected to the one or more first anode strips and the one or more second anode strips in the second electrically conductive anode layer, may be oppositely alternate with respect to the alternate gate connection strips of the sets of first and second gate connection units, which are connected to by the one or more first anode strips and the one or more second anode strips in the first electrically conductive anode layer.

Each first anode strip in the first electrically conductive anode layer may be connected to alternate gate connection strips of the set of first gate connection units in the gate connection layer at a plurality of regularly spaced points along each gate connection strip. Each second anode strip in the first electrically conductive anode layer may be connected to alternate gate connection strips of the set of second gate connection units in the gate connection layer at a plurality of regularly spaced points along each alternate gate connection strip.

Each first anode strip in the second electrically conductive anode layer may be connected to opposite alternate gate connection strips of the set of first gate connection units in the gate connection layer at a plurality of regularly spaced points along each alternate gate connection strip. Each second anode strip in the second electrically conductive anode layer may be connected to opposite alternate gate connection strips of the set of second gate connection units in the gate connection layer at a plurality of regularly spaced points along each alternate gate connection strip.

The regular spacing of the inter-layer connections from the first and second anode strips in the first and second anode layers to the gate connection strips in the gate connection layer provides symmetry to the varactor. This symmetry in turn can advantageously allow for good differential operation of the device and maintain a distribution of inter-layer connections over the area of the varactor to the bulk to lower the electrical resistance, thereby enhancing performance. That is, by spreading the inter-layer connections over the area of the varactor rather than concentrating the connections in one or more places and leaving other areas connection-free, the electrical resistance of the varactor can be enhanced. The symmetric design of the varactor is advantageous for differential operation of the varactor as less noise may be exchanged with the lossy substrate due to the symmetry.

The one or more first anode strips and the one or more second anode strips in the first electrically conductive anode layer may each be connected at one or both ends to the first anode connection frame. The first anode connection frame may be provided around some or all of the periphery of the anode strips in the first electrically conductive anode layer. The one or more first anode strips and the one or more second anode strips in the second electrically conductive anode layer may each be connected at one or both ends to the second anode connection frame. The second anode connection frame may be provided around some or all of the periphery of the anode strips in the second electrically conductive anode layer. In some examples each anode strip may be connected to a corresponding anode frame at each end of each anode strip.

The use of first and second anode connection frames and a cathode connection frame, one or more of which may be located at the periphery of the varactor, advantageously allows for the convenient abutment of the varactor structure to neighbouring unit cells or other components in the integrated package, which in turn allows a higher capacitance value varactor to be constructed. Such abutment may not require any additional connection between components.

The first anode connection frame and the second anode connection frame may be exposed on at least one side surface of the integrated circuit based varactor for electrical connection to other components in the same integrated package. This advantageously allows for readily available electrical connection points, potentially at any point around the periphery of the varactor, thereby providing the layout designer with greater freedom for layout/circuit design and not restricting the allowed connection points to the varactor to be at limited locations.

The first and second anode strips in the first and/or second electrically conductive anode layers may be wider at regions of connection to the gate connection strips than between the regions of connection.

By narrowing the width of each anode strip within each anode layer between connection points to the gate connection layer, the parasitic contribution to the capacitance of the varactor may be decreased compared with anode layers having no narrower regions. Decreasing the width of the anode strips where possible (such as between connection points to the gate connection layer) reduces the parasitic capacitance as the connection paths, that is anode strips between connection points, are narrower. A lower parasitic capacitance advantageously allows a wider tuning range to be accessed. The parasitic capacitance present between the first and second anode layers can have a significant effect on the possible tuning range.

The connections between first and second anode strips in the first and/or second electrically conductive anode layer to the gate connection strips may comprise multiple vertical/via connections.

Multiple vias may comprise a cluster of mini-vias forming a multiple via connection. By using multiple via connections in a cluster, rather than a single via connection, the resistive losses between the first and second anode layers and the gate connection layer can be reduced. Further, by using vias to provide substantially vertical connections between electrically conductive layers, the length of the electrical path through the varactor can be reduced or minimised, thereby reducing resistive losses further.

The integrated circuit based varactor may comprise a first dielectric layer located between the gate connection layer and the first electrically conductive anode layer. The integrated circuit based varactor may comprise a second dielectric layer located between the first electrically conductive anode layer and the second electrically conductive anode layer. Such dielectric layers may comprise oxides, for example.

The integrated circuit based varactor may be configured such that, in use, there is a phase difference of 180 degrees between signals in the first anode layer and signals in the second anode layer when the integrated circuit based varactor is operational.

There may be provided an oscillator comprising any integrated circuit based varactor described herein.

A description is now given, by way of example only, with reference to the accompanying drawings, in which:—

Figure 7:
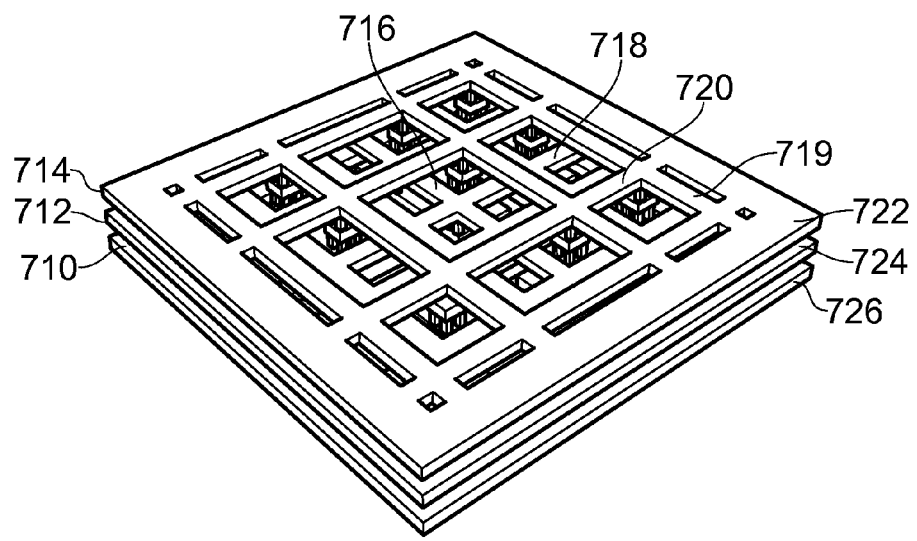
Figure 8:
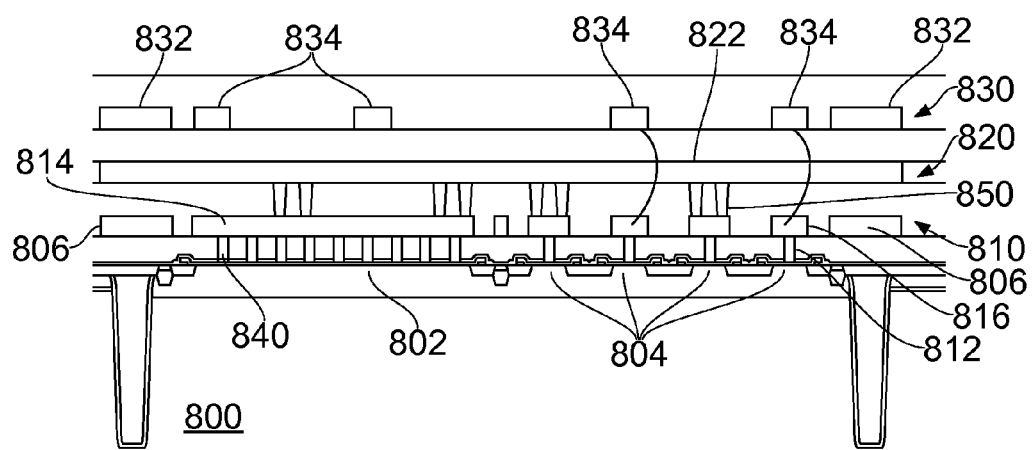
Figure 10:
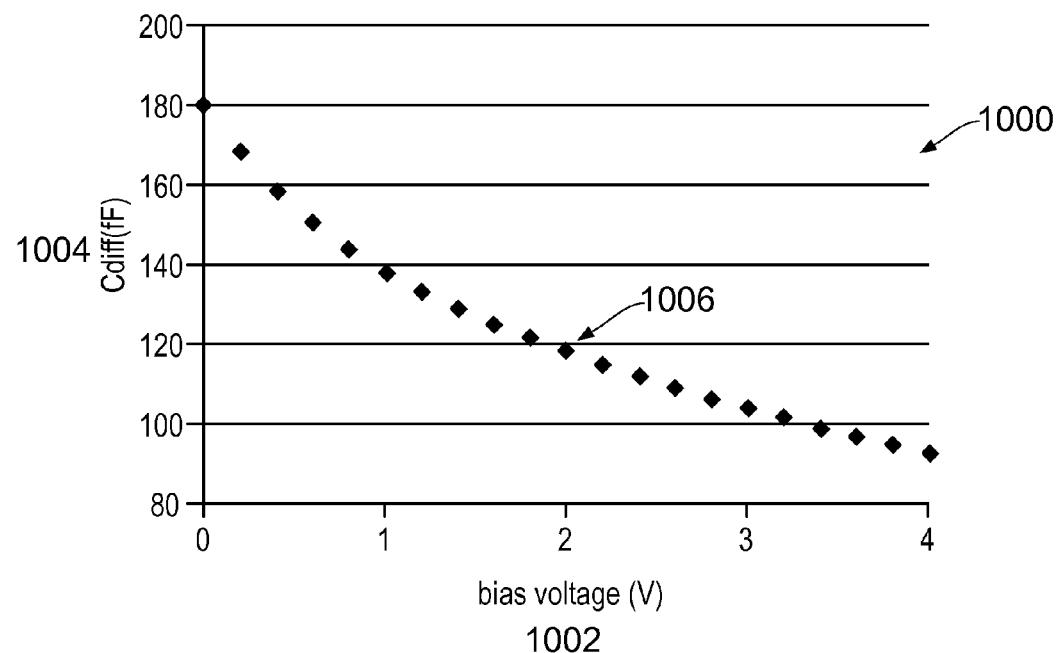
Figure 11:
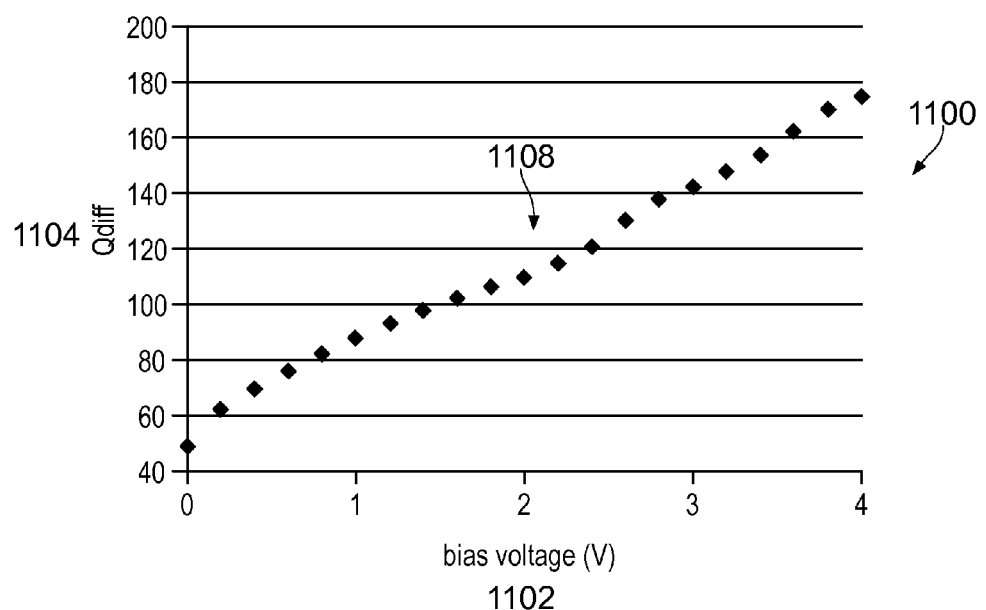

FIGS. 6*a*-6*f* illustrate schematically a synoptic construction of a varactor according to an embodiment of the invention;

FIG. 7 illustrates schematically a three-dimensional view of a varactor according to an embodiment of the invention;

FIG. 8 illustrates schematically a cross sectional view of a varactor according to an embodiment of the invention;

FIGS. 9a-9g illustrate schematically a synoptic construction of a varactor according to an embodiment of the invention;

FIG. 10 illustrates a graph showing variations of differential capacitance for a varactor according to an embodiment of the invention; and FIG. 11 illustrates a graph showing experimental variations of differential quality factor for a varactor according to an embodiment of the invention.

Embodiments of the present invention relate to integrated circuit based varactors comprising a substrate, wherein the substrate comprises a set of first gate units and a set of second gate units. The sets of first and second gate units each comprise a plurality of substantially parallel gate strips. The sets of first and second gate units are located such that the gate strips of the set of first gate units are oriented transverse to the gate strips of the set of second gate units. Gate connection units and anode strips are located above the gate units. Through the specific arrangement of these components, a varactor may be produced with both a high quality factor Q and a wide tuning range. The particular arrangement of varactor elements (including gate units, gate connection units, anode strips, anode frames and cathode connection frame) provide a symmetrical varactor which allows good differential operation.

For both high frequency applications and high performance applications, such as applications operating in the $K_u$, K and $K_a$ frequency bands up to the W and THz frequency bands, circuit design requires a combination of analogue and microwave design techniques and may incorporate the use of transmission lines, splitters, couplers and transformers.

Typically, the integration of local oscillators presents new challenges. These challenges mainly relate to the limited tuning range achievable in practical implementations, and to strict requirements in terms of the acceptable phase noise performance imposed by communication standards.

Use of a high oscillator amplitude can help to achieve low phase noise. This can be achieved by either increasing the biasing current or increasing the tank inductance (assuming a given quality factor). Increasing the biasing current has a disadvantageous consequence of increasing the power consumption. Increasing the tank inductance has a disadvantageous consequence of reducing the frequency tuning range.

Therefore, there can be a trade-off between achieving a low phase noise, a high tuning range and acceptable power consumption. In order to optimise this trade-off, LC tanks having a transformer instead of single coils may be considered. As an alternative, a varactor may be used as tuning element in an integrated oscillator.

A varactor acts as a variable capacitor; the capacitance varies depending on the applied voltages (DC and/or RF) applied to its terminals. Currently, in standard bipolar or BiCMOS (Bipolar junction—complementary-metal-oxide-semiconductor) technologies, varactors are typically used as (reverse biased) junction diodes or as MOS (metal-oxide-semiconductor) varactors.

Varactor performance may be characterized by three parameters:
- the capacitance ratio ($C_{max}/C_{min}$);
- the tuning range TR=($C_{max}-C_{min}$)/($C_{max}+C_{min}$); and
- the quality factor Q.

The capacitance ratio has a direct influence on the oscillator tuning characteristics, since the tuning range is limited by a) the ratio between the fixed (parasitic) capacitances and the varactor capacitance, and b) the voltage-frequency characteristics of the varactor (capacitance ratio).

In the low GHz frequency range, varactors can provide quality factors which are considerably higher than inductors, and hence they have little influence on the oscillator phase noise performance. However, for frequencies of 10 GHz and above, the quality factor of varactors can seriously limit the resonator performance and consequently, the oscillator phase noise.

Figure 1:
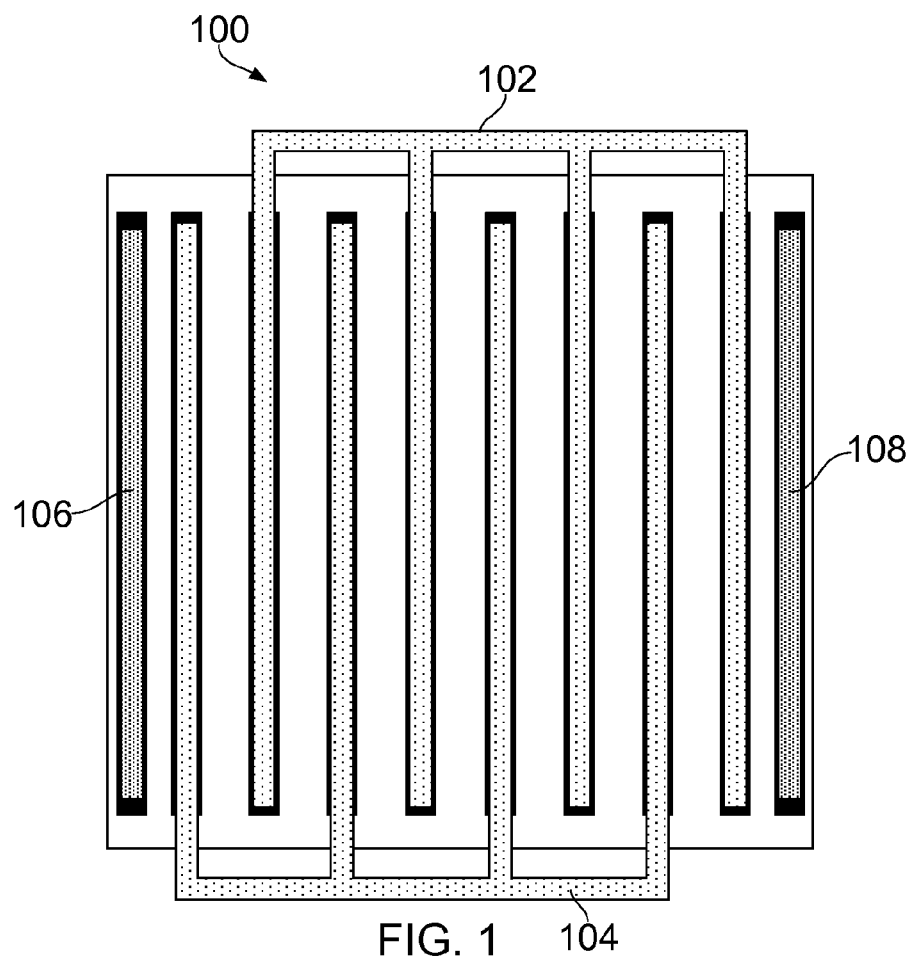
FIG. 1 illustrates schematically a "finger-type" topology varactor.

FIG. 1 shows a "finger-type" varactor topology 100 with two sets of interdigitated anodes 102, 104. Such a varactor topology may be used as a compromise between ease of layout and the overall varactor performance. A tuning range of 0.35 may be achievable. A connection to the bulk may typically be made outside the fingers of anodes 102, 104 on two sides of the device 106, 108. A quality factor for this type of varactor may typically be of the order of 30-40 at a frequency of 5 GHz for devices exhibiting a capacitance value of 150 fF at 0V biasing.

Figure 2:
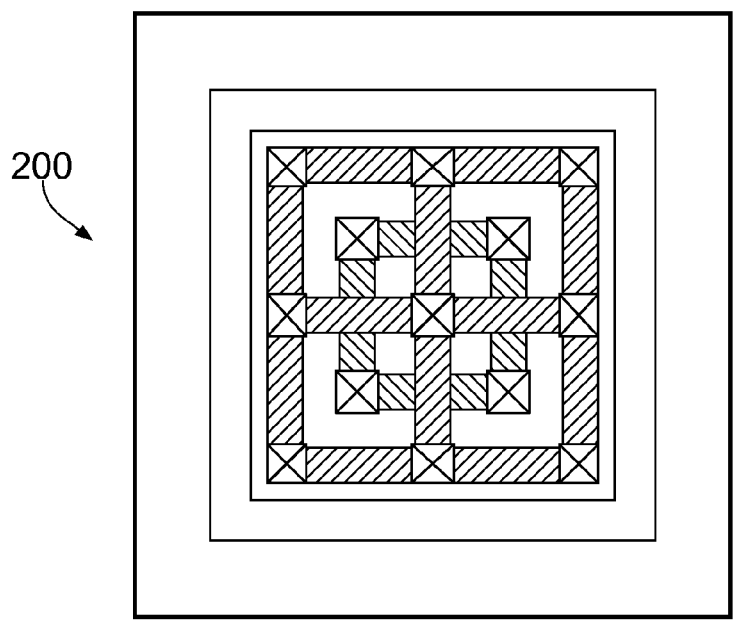
FIG. 2 illustrates schematically an "island-gate" topology varactor.

FIG. 2 shows an island-gate" varactor IGV 200 which can improve on the quality factor of MOS varactors.

IGV type varactors may allow an enhanced quality factor to be achieved compared with a "finger-type" varactor. Typically, quality factors for an IGV of 35-40 may be achieved for a 50 fF device at 10 GHz. Such an IGV can require six metal layers to construct the varactor. This high number of metal layers can decrease the serial electrical resistance of the IGV. Using an IGV topology can also reduce the density integration, since a relatively large region of on-chip space is required for the IGV which includes a significant "non-active" area. Further, using an IGV topology tends to increase the parasitic capacitance contribution that limits the working frequency of the IGV, and also limits the tuning range of the IGV.

Figure 3:
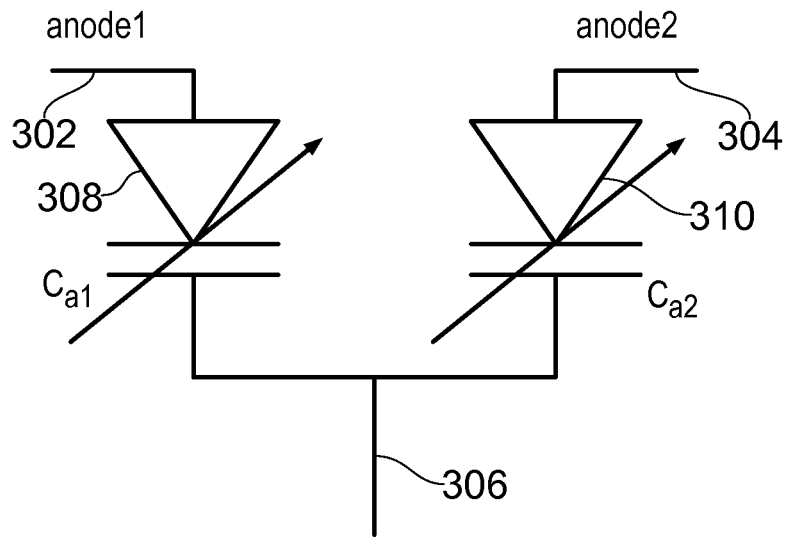
FIG. 3 illustrates schematically a circuit symbol representation of a differential varactor.

The theoretical background of varactors will now be discussed briefly. FIG. 3 shows a schematic circuit symbol representation of a differential varactor. There is shown a first anode connection (anode 1) 302 to the anode of a first varactor 308. The first varactor 308 has a capacitance $C_{a1}$. A second anode connection (anode 2) 304 to the anode of a second varactor 310 is also shown. The second varactor 310 has a capacitance $C_{a2}$. The cathodes of each varactor 308, 310 are coupled together to provide a common cathode terminal 306.

A differential capacitance $C_{diff}$, related to frequency f, may be given by:

$$C_{diff} = \frac{imag(Y_{11} - Y_{12} - Y_{21} + Y_{22})}{8\pi f}$$

Where $Y_{11}, Y_{12}, Y_{21}$ and $Y_{22}$ are admittance terms of the 2×2 admittance matrix; and f is the working frequency. Admittance matrices are known in the art.

A differential resistance $R_{diff}$ may then be given by:

$$R_{diff} = real\left(\frac{4}{Y_{11} - Y_{12} - Y_{21} + Y_{22}}\right)$$

The quality factor $Q_{diff}$ of the varactor may then be deduced from the previous relations as:

$$Q_{diff} = \frac{1}{imag(Y_{11} - Y_{12} - Y_{21} + Y_{22}) \cdot real(Y_{11} - Y_{12} - Y_{21} + Y_{22})} \approx$$

$$\frac{\text{imag}(Y_{11} - Y_{12} - Y_{21} + Y_{22})}{\text{real}(Y_{11} - Y_{12} - Y_{21} + Y_{22})}$$

The quality factor $Q_{diff}$ is not the only parameter that needs to be taken into account to evaluate varactor efficiency. The tuning range TR is also relevant. A figure of merit (FoM) may be introduced as:

$$\text{FoM} = f \cdot TR \cdot Q_{diff}$$

The FoM represents a quantity used to characterise the performance capabilities of the varactor. It may be used as a measure of performance for the comparison of different varactor designs.

In a real circuit environment, a varactor device may be connected by metal from the Back-End Of Line (BEOL). A primary goal of such metal interconnections is to minimize the resistive losses of the circuit. These metal interconnections have a significant impact on the device behaviour itself, and they add a parasitic capacitance as shown in FIG. 4.

Figure 4:
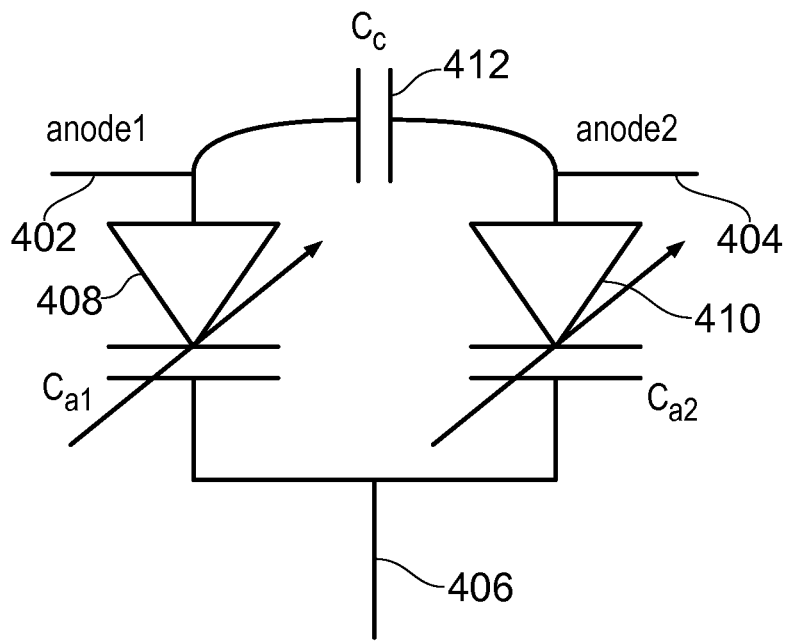
FIG. 4 illustrates schematically a circuit symbol representation of a differential varactor with a parallel parasitic capacitance.

FIG. 4 shows a schematic circuit symbol representation of a differential varactor including a parasitic capacitor $C_c$ 512. The features of FIG. 4 that are common to FIG. 3 will not be described again here.

$C_c$ represents the coupling capacitance due to the interconnecting metal part. Considering that $C_{a1} = C_{a2} = C_a$, it may be determined that:

$$TR = \frac{C_{amax} - C_{amin}}{C_{amax} + C_{amin}}$$

By introducing the parasitic coupling capacitance $C_c$ and by considering the differential capacitance, the tuning range $TR_C$ taking into account $C_c$ may be given by:

$$TR_c = \frac{C_{amax} - C_{amin}}{C_{amax} + C_{amin} + 4C_c}$$

It can be seen that a larger coupling capacitance $C_c$ will degrade the tuning range of the varactor device. That is, a larger parasitic capacitance decreases the tuning range. To estimate the tuning range degradation, the following expression may be used which gives the percentage variation % var in the tuning range TR:

$$\% \text{ var} = \left(\frac{TR_c}{TR} - 1\right) \cdot 100 = -\frac{400 \cdot C_c}{C_{amax} + C_{amin}}$$

Thus it can be seen that if $C_c$ is 10% of $C_{max} + C_{min}$, the tuning range will be reduced by 40%. Therefore it is important to connect to the varactor in such a way as to minimise the parasitic capacitance. From a layout point of view, there is a trade-off between a wide tuning range and a high quality factor to optimise the intrinsic performance of the varactor.

If a "finger-type" varactor is considered as shown in FIG. 1, having a $C_{diff} = 150$ fF at 0V biasing, it may be found that adding the interconnect paths to the BEOL in the device degrades the tuning range by 13% while the quality factor increase by a maximum of 11%. In summary, by computing the FoM proposed above:

A "finger-type" varactor alone has a FoM=$113 \times 10^9$

A "finger-type" varactor with interconnects has a FoM=$109 \times 10^9$

The FoM both with and without the interconnects is roughly the same. This means that both the layout of the varactor and the interconnection strategy may be improved in order to benefit the performance of the varactor.

One or more embodiments disclosed herein may be considered to provide a varactor with a structure which may be connected to allow improvements in the quality factor obtained whilst maintaining a wide tuning range.

Figure 5:
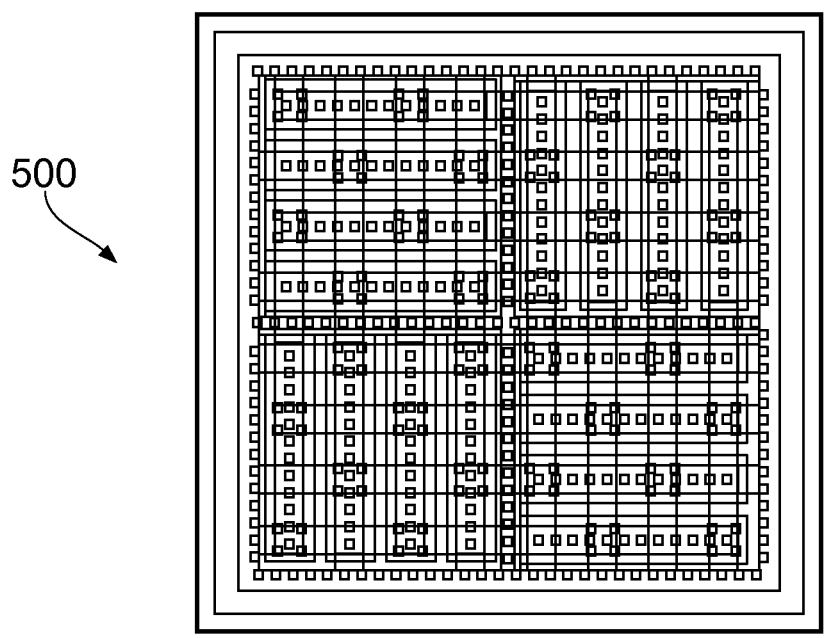
FIG. 5 illustrates a layout topology of a varactor according to an embodiment of the invention.

FIG. 5 illustrates a layout topology of a varactor 400 according to an embodiment of the present disclosure. For such a varactor, a quality factor of 174 has been measured at a frequency of 5 GHz with a $C_{diff} = 140$ fF. This quality factor is roughly twice that which could be obtained for the finger-type varactor of FIG. 1.

The concept behind the varactor 500 of FIG. 5 can be considered as "breaking" the combs (sets of fingers) of a "finger-type" varactor in order to make smaller combs. Then, one half of these smaller combs may be positioned with the fingers transverse to the fingers of the other smaller combs. Each set of smaller combs in one layer forms an anode layer. Interconnections between layers may be made between each set of smaller combs (that is, each anode layer) and a gate connection layer. Such a varactor design can retain the symmetry required for good differential operation and maintain a distribution of interconnections over the area of the varactor to the bulk to lower the electrical resistance, thereby further improving performance.

Interconnections may be made such that each smaller comb, which may be thought of as a unit cell, may be abutted with a neighbouring unit cell. Such unit cell positioning allows a high quality factor to be maintained additional connectors to electrically connect the cells together may not be required, therefore avoiding the introduction of additional parasitic losses. Putting a plurality of n cells in parallel multiplies the capacitance by n and divides the resistance by n. Since the Q-factor is inversely proportional to both R and C, the Q-factor can therefore be maintained. Further, interconnections between the layers of the varactor may be optimised (by having small crossings between anode layers) in such a way that the coupling capacitance $C_c$ is reduced to an acceptable minimum value which allows a desirable wide tuning range to be obtained.

The geometry of the proposed varactor device is not limited to having square gates, as for example, an IGV varactor is restricted. The varactor 500 of FIG. 5 may not require the use of IC process top metals whereas an IGV varactor does require such IC process top metals. Fewer metal layers and minimising the amount of top-metal layers required can reduce the parasitic capacitance of the varactor.

A detailed description of a varactor according to an embodiment of the present disclosure is described below with respect to FIGS. 6a-6f.

Figure 6A:
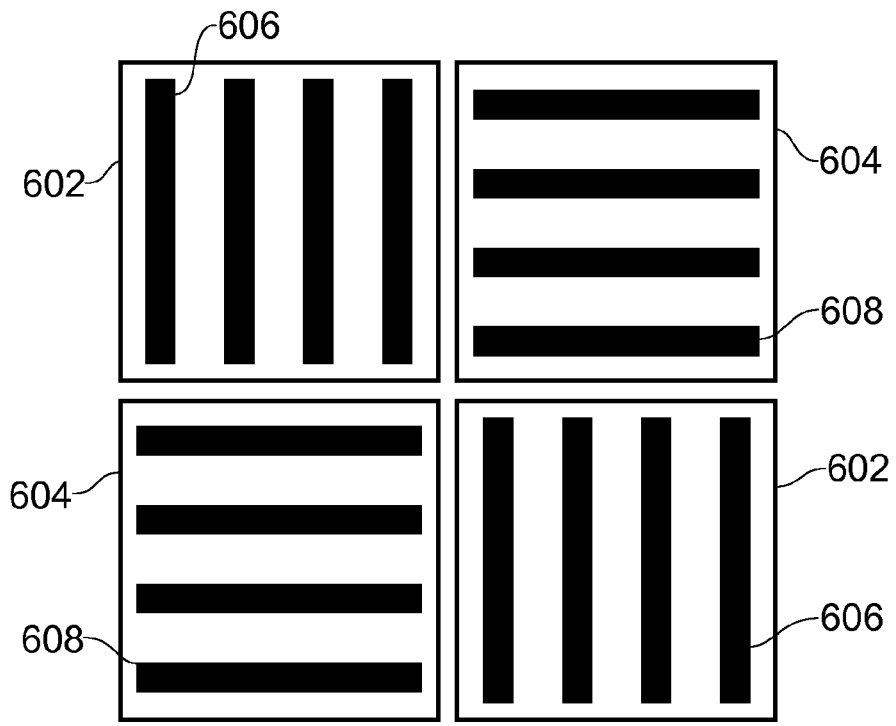

FIG. 6a shows an implementation of four sets of varactor gates having an orthogonal placement. A substrate is shown comprising two first gate units 602 and two second gate units 604 in a two by two grid of gate units. Each first gate unit 602 neighbours two second gate units 604, and vice versa. Each of the sets of first and second gate units 602, 604 each comprise a plurality of substantially parallel gate strips 606, 608. The two first gate units 602 each have four substantially parallel gate strips 606 shown oriented in the vertical direction, and the two second gate units 604 each have four substantially parallel gate strips 608 shown oriented in the horizontal direction. The sets of first and second gate units 602, 604 are located such that the gate strips 606 of the set of first gate units 602 are oriented transverse to the gate strips 608 of the set of second gate units 604. Thus the first and second gate units are arranged alternately in a checkerboard-type pattern. A particular gate unit has gate strips oriented in one direction, and has at least one horizontally and/or vertically directly neighbouring gate unit with gate strips oriented in a different direction.

The gate strips 606 of the set of first gate units 602 and the gate strips 608 of the set of second gate units 604 are metal plates laid down over the silicon substrate. There is a very thin oxide located between the metal plates 606, 608 and the silicon substrate. There is no contact between the substrate and the gate.

Figure 6B:
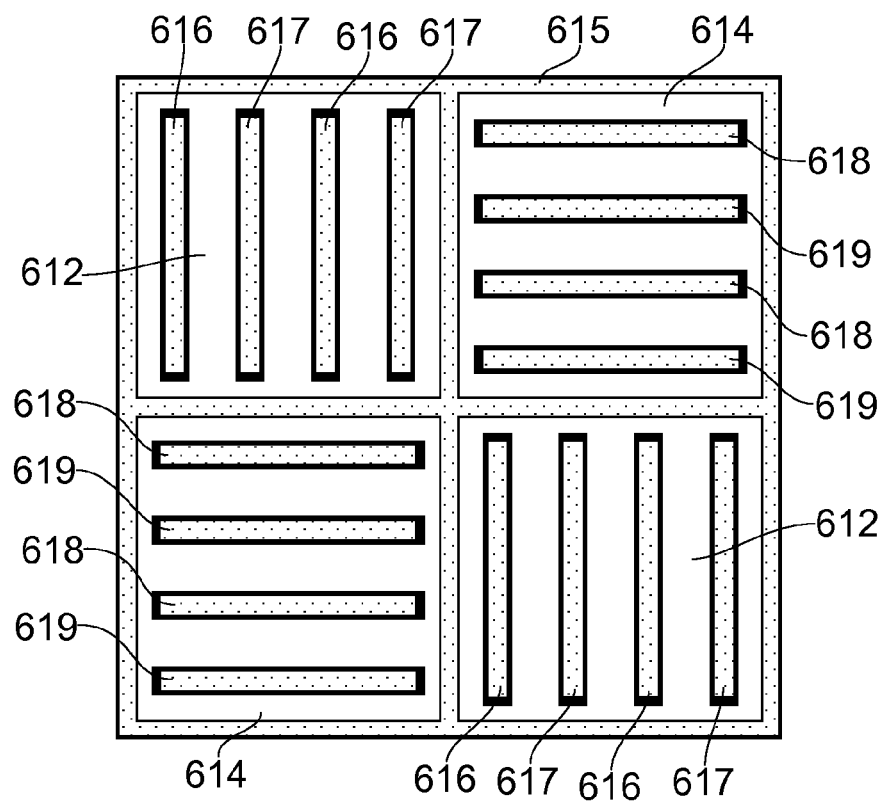

FIG. 6b shows an implementation of gate connection strips 616, 617, 618, 619 in an electrically conducting gate connection layer. The gate connection strips 616, 617, 618, 619 overly the gate strips 606, 608 of FIG. 6a. This electrically conducting gate connection layer comprises a set of first gate connection units 612 and a set of second gate connection units 614. Each of the sets of first and second gate connection units 612, 614 comprises a plurality of substantially parallel gate connection strips 616, 617, 618, 619. The two first gate connection units 612 each have four substantially parallel gate connection strips 616, 617 shown oriented in the vertical direction. The two second gate connection units 614 each have four substantially parallel gate connection strips 618, 619 shown oriented in the horizontal direction. The gate connection strips 616, 617 of the set of first gate connection units 612 and the gate connection strips 618, 619 of the set of second gate connection units 614 are located substantially over and coincident with the gate strips 602, 604 of the sets of first and second gate units 606, 608.

FIG. 6b also shows a cathode connection frame 615 forming a bulk connection around the outside of the varactor. Such a bulk cathode connection frame 615 may be thought of as a donut-type connection as it forms a ring around the outside of the varactor.

The cathode connection frame 615 is also located around each side of each of the gate connection units 612, 614. The cathode connection frame 615 may be thought of as a multiple-frame photo frame, with each gate connection unit, or 'photo', surrounded by one of the multiple frames of the cathode connection frame 615, such that each gate connection unit is framed. Providing the cathode connection frame 615 in this way can correctly distribute a signal to this cathode connection. With the proposed layout, each unit/cell has four connections, so the electrical resistance is in theory divided by 24 when compared with a connection on only one side of a unit/cell. The gate connection strips 616, 617, 618, 619 and the cathode connection frame 615 are made in a first layer of metallisation.

Figure 6C:
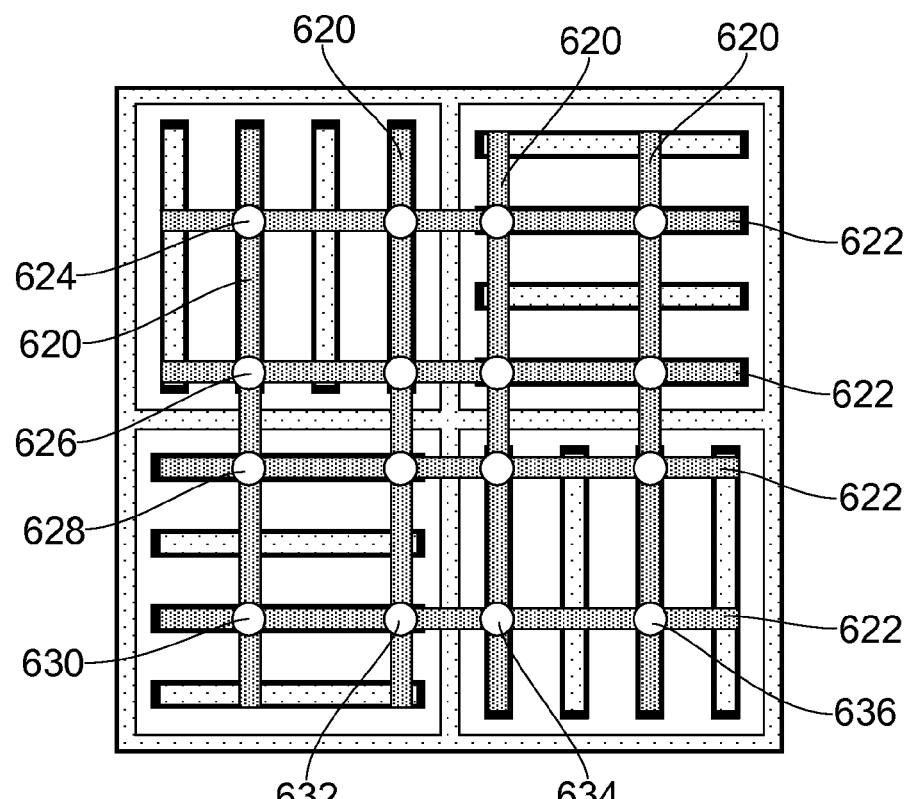

FIG. 6c shows the implementation of first anode connections, or strips, made in a second layer of metallisation, which may be considered to be a first electrically conductive anode layer. Four vertically oriented first anode strips 620 and four horizontally oriented second anode strips 622 are shown. Each anode strip 620, 622 in the first anode layer spans almost the entire width/length of the varactor. That is, each anode strip 620, 622, spans across all the gate units 602, 604 and gate connection units 612, 614.

The first electrically conductive anode layer therefore comprises one or more first anode strips 620 located substantially parallel to the gate connection strips 616, 617 of the set of first gate connection units 612, and one or more second anode strips 622 located substantially parallel to the gate connection strips 618, 619 of the set of second gate connection units 614.

Each first anode strip 620 is connected to alternate gate connection strips 617 of the set of first gate connection units 612 by vertical connectors 624, 626, 634, 636. Each first anode strip 620 is also connected to alternate gate connection strips 618 of the set of second gate connection units 614 by vertical connectors 628, 630, 632. Each first anode strip 620 in the first electrically conductive anode layer is connected 624, 626 to alternate gate connection strips 617 of the set of first gate connection units 612 at a plurality of regularly spaced points 624, 626 along each alternate gate connection strip 617. In this example, each first anode strip 620 is connected 624, 626 to alternate gate connection strips 617 at two regularly spaced points 624, 626 along each alternate gate connection strip 617.

The regular spacing of the vertical connectors 624, 626, 628, 620 to the first anode strips 620 may in this example be considered regular along the length of the varactor over connections to the first and second gate connection strips 617, 618 in the first and second gate connection units 612, 614. That is, the connections from the first anode strips 620 are not bunched together at one end or at a particular point on the first anode strip 620, but they are spaced out over the length of each first anode strip 620.

Each second anode strip 622 is connected to the alternate gate connection strips 618 of the set of second gate connection units 614 by vertical connectors 628, 630, 632. Each second anode strip 622 is also connected to the alternate gate connection strips 617 of the set of first gate connection units 612 by vertical connectors 624, 626, 634, 636. Each second anode strip 622 in the first electrically conductive anode layer is connected 630, 632 to alternate gate connection strips 618 of the set of second gate connection units 614 at a plurality of regularly spaced points along each alternate gate connection strip. In this example, each second anode strip 622 is connected 630, 632 to alternate gate connection strips 618 at two regularly spaced points 630, 632 along each alternate gate connection strip 618.

The regular spacing of the vertical connectors 630, 632, 634, 636 to the second anode strips 622 may in this example be considered regular along the width of the varactor over connections to the first and second gate connection strips 617, 618 in the first and second gate connection units 612, 614.

The vertical connectors may be referred to as vias. One or more of the vertical connectors in FIG. 6c may be provided by a single via, or by a series, or cluster, of multiple vias per connection point.

In this example the vertical connectors are provided at the intersections between the first anode strips 620 and the second anode strips 622 in the first electrically conductive anode layer.

Figure 6D:
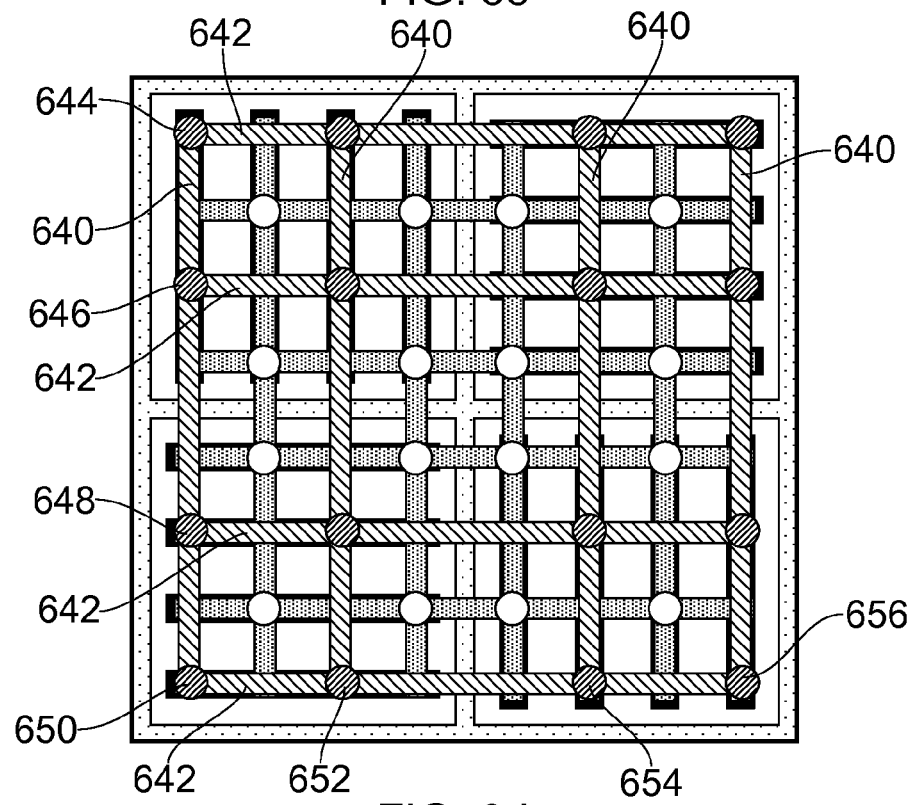

FIG. 6d shows the implementation of the second anode connections made in a third layer of metallisation, which may be considered a second electrically conductive anode layer. Four vertically oriented first anode strips 640 and four horizontally oriented second anode strips 642 are shown. Each anode strip 640, 642 in the second anode layer spans almost the entire width/length of the varactor. That is, each anode strip 640, 642 spans across all the gate units 602, 604 and gate connection units 612, 614.

The second electrically conductive anode layer therefore comprises one or more first anode strips 640 located substantially parallel to the gate connection strips 616 of the set of first gate connection units 612, and one or more second anode strips 642 located substantially parallel to the gate connection strips 619 of the set of second gate connection units 614.

Each first anode strip 640 is connected to opposite alternate gate connection strips 616 of the set of first gate connection units 612 by vertical connectors 644, 646, 654, 656. Each first anode strip 640 is also connected to opposite alternate gate connection strips 619 of the set of second gate connection units 614 by vertical connectors 648, 650, 652. Each first anode strip 640 in the second electrically conductive anode layer is connected 644, 646 to opposite alternate gate connection strips 616 of the set of first gate connection units 612 at a plurality of regularly spaced points 644, 646 along each alternate gate connection strip 616. In this example, each first anode strip 640 is connected 644, 646 to alternate gate connection strips 616 at two regularly spaced points 644, 646 along each alternate gate connection strip 616.

Each second anode strip 642 is connected to the opposite alternate gate connection strips 619 of the set of second gate connection units 614 by vertical connectors 648, 650, 652. Each second anode strip 642 is also connected to the opposite alternate gate connection strips 616 of the set of first gate connection units 612 by vertical connectors 646, 654, 656. Each second anode strip 642 in the first electrically conductive anode layer is connected 650, 652 to alternate gate connection strips 619 of the set of second gate connection units 614 at a plurality of regularly spaced points along each alternate gate connection strip. In this example, each second anode strip 642 is connected 650, 652 to alternate gate connection strips 619 at two regularly spaced points 650, 652 along each alternate gate connection strip 619. In this example, the connections are provided at the intersections between the first anode strips 640 and the second anode strips 642 in the second electrically conductive anode layer.

The opposite alternate gate connection strips 616, 619 of the sets of first and second gate connection units 612, 614, connected to by the anode strips 640, 642 in the second electrically conductive anode layer, are oppositely alternate with respect to the alternate gate connection strips 617, 618 of the sets of first and second gate connection units 612, 614, connected to by the anode strips 620, 622 in the first electrically conductive anode layer.

Thus the first and second anode strips 620, 622 in the first anode layer only connect to the alternate gate connection strips 617, 618, and do not connect to the opposite alternate gate connection strips 616, 619. Similarly the first and second anode strips 640, 642 in the second anode layer only connect to the opposite alternate gate connection strips 616, 619, and do not connect to the alternate gate connection strips 617, 618.

Figure 6E:
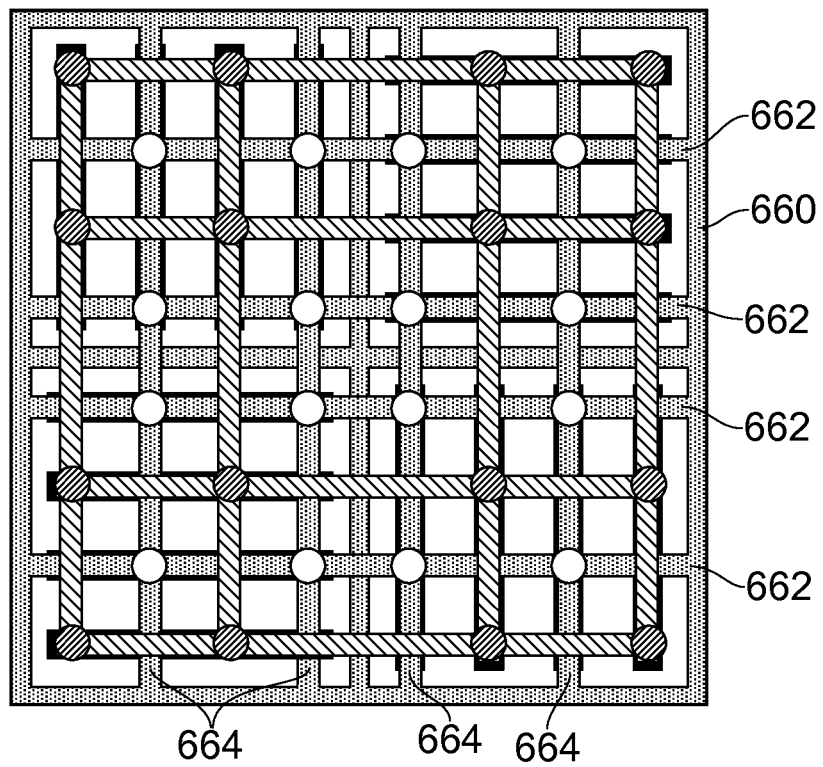

FIG. 6e shows the implementation of a first anode connection frame 660, which may be thought of as a donut connection. The first anode connection frame 660 is located in the first anode layer in the second layer of metallisation, along with the first and second anode strips 620, 622 of the first anode layer shown in FIG. 6c. This first anode connection frame 660 may be implemented at the same stage as the first and second anode strips 620, 622 shown in FIG. 6c. This first anode connection frame 660 allows auto-abutment of the unit cells to other components within the integrated package.

The one or more first anode strips 620 and the one or more second anode strips 622 in the first electrically conductive anode layer are each connected at each end to the first anode connection frame 660 in this example. Some of the joins between the anode strips and the first anode connection frame are shown with reference numbers 662, 664 in FIG. 6e. It will be appreciated that in other examples, any anode connection can be used to provide an external connection to one or more of the first anode strips 620 and/or second anode strips 622. Since the first and second anode strips intersect with each other, as they are in the same metallic layer, it may not be necessary for the anode connection to be in direct contact with each anode strip.

Figure 6F:
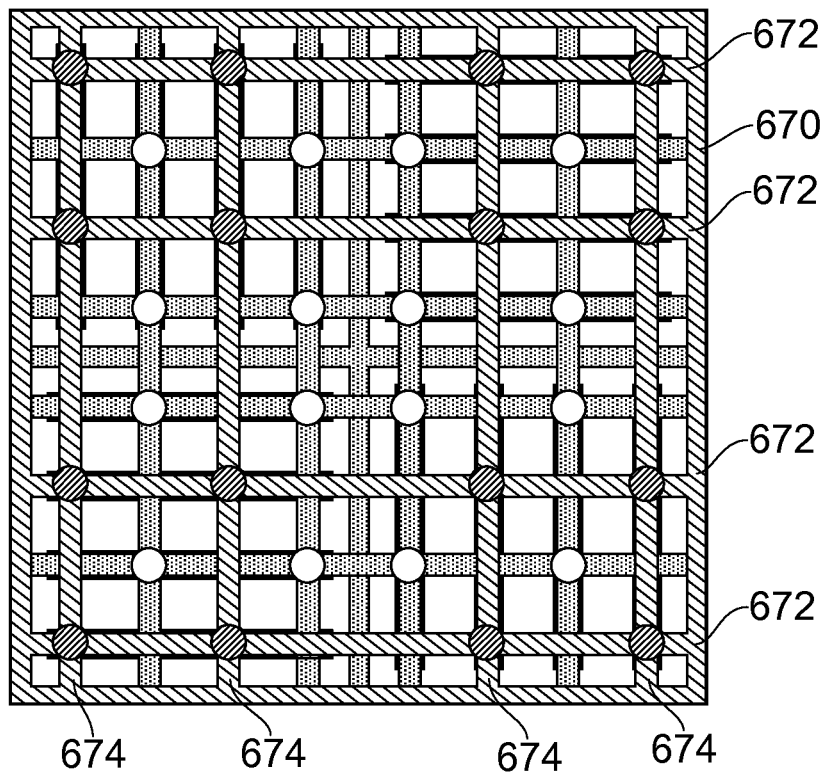

FIG. 6f shows the implementation of a second anode connection frame 670, which may be thought of as a donut connection. The second anode connection frame 670 is located in the second anode layer in the third layer of metallisation, along with the first and second anode strips 640, 642 of the second anode layer shown in FIG. 6d. This second anode connection frame 670 may be implemented at the same stage as the first and second anode strips 640, 642 shown in FIG. 6d. This second anode connection frame 670 allows auto-abutment of the unit cells to other components within the integrated package.

The one or more first anode strips 640 and the one or more second anode strips 642 in the second electrically conductive anode layer are connected to the second anode connection frame 670 in the same way as the anode strips in the first electrically conductive anode layer are connected to the connection frame in the first electrically conductive anode layer. In this example, the first anode strips 640 and second anode strips 642 are each connected at each end to the second anode connection frame 670. Some of the joins between the anode strips and the second anode connection frame are shown with reference numbers 672, 674 in FIG. 6f.

FIG. 7 illustrates schematically a three-dimensional view of the varactor described with reference to FIGS. 6a-6f. The electrically conducting gate connection layer 710 is shown with the cathode connection frame 726 visible. The first electrically conductive anode layer 712 is located on top of the gate connection layer 710. The second electrically conductive anode layer 714 is located on top of the first electrically conductive anode layer 712. The first and second anode strips 716, 718 of the first anode layer 712 can be seen within, and in the same metal layer as, the first anode connection frame 722. The first and second anode strips 719, 720 of the second anode layer 714 can also be seen within, and in the same metal layer as, the second anode connection frame 724.

The first anode connection frame 722 and the second anode connection frame 724 are exposed on at least one side surface of the integrated circuit based varactor for electrical connection. In the schematic representation of FIG. 7, all four sides of the square varactor are exposed for electrical connection.

FIG. 8 illustrates schematically a cross sectional view of a varactor according to an embodiment of the present disclosure. The cross section is of a 2×2 varactor as shown in FIGS. 6a-c and 7. Thus the cross sections of two gate units (and two gate connection units) are shown.

The bulk of the substrate 800 is shown at the bottom of the varactor. On top of the bulk 800 are varactor gates 802, 804, shown schematically as raised regions at the surface of the bulk substrate 800. Shown on the left side of FIG. 8 is a cross section along the long edge of a gate strip 802 in a first gate unit. On the right side of FIG. 8, the cross section across the lateral width of four gate strips in a second gate unit 804 are shown.

The electrically conducting gate connection layer 810 is located over the varactor gates 802. The electrically conducting gate connection layer 810 comprises gate connection strips 814, 816 and a cathode connection frame 806 at the outside of the gate connection strips 814, 816. The layout of the gate connection strips 814, 816 corresponds with the layout of the gate strips 802, 804. The gate connection strips 814, 816 are electrically connected to the underlying gate units 802, 804 through an insulating layer therebetween by vias 812, 840. The insulating layer may be a dielectric. It can be seen in the cross section that, for the gate connection strip 814 connected to the gate strip 802, multiple vias 840 are used for the connection (nine vias are shown in this example).

The first electrically conductive anode layer 820 is located on top of the gate connection layer 810. A second anode strip 822 is shown in cross section along the length of the strip 822. The anode strips 822 in the first anode layer 820 are connected to alternate gate connection strips 816 in the gate connection layer 810 by multiple vias 850 through an insulating layer therebetween. The insulating layer may be a dielectric.

The second electrically conductive anode layer 830 is located on top of the first electrically conductive anode layer 820. The ends of four first anode strips 834 are shown in cross section in the second anode layer 830. Also shown in the second anode layer 830 is the second anode frame 832 at the outside of the anode strips 834. Although not visible in FIG. 8 due to the cross section shown, the anode strips 834 in the second anode layer 830 are connected to opposite alternate gate connection strips 816 in the gate connection layer 810 by multiple vias through an insulating layer therebetween. The insulating layer may be a dielectric.

The varactor layout topology described in relation to FIGS. 5, 6a-6f, 7 and 8 allows a low value of electrical resistance to be obtained together with an acceptable parasitic coupling capacitance which may not significantly deteriorate the tuning range possible of the varactor. The parasitic capacitance present between the two anode layers is primarily responsible for determining the possible tuning range, with an increased parasitic capacitance causing a narrowing of the possible tuning range of the varactor.

FIGS. 9a-9f illustrate a varactor according to another embodiment of the present invention. In this example, the parasitic capacitance between the two anode layers has been further decreased by narrowing the anode strips in each anode layer between regions of connection to the underlying gate connection layer.

Figure 9A:
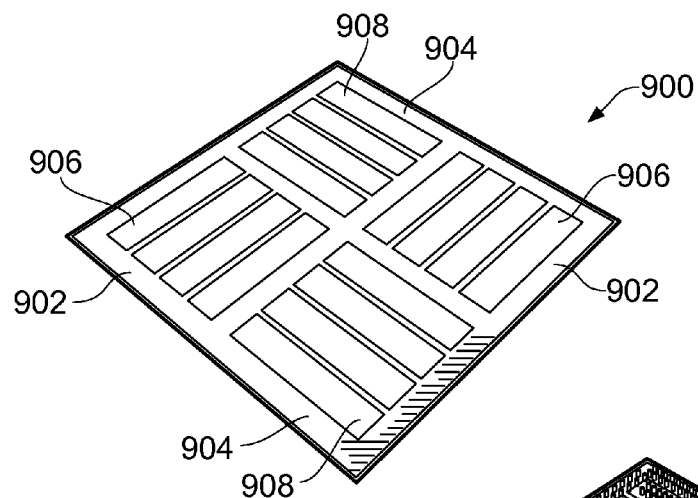

FIG. 9a illustrates the implementation of varactor gates by the orthogonal placement of unit clusters of gate strips. A substrate 900 is shown comprising a set of two first gate units 902 and a set of two second gate units 904 in a two by two grid of gate units. Each of the sets of first and second gate units 902, 904 comprise a plurality of substantially parallel gate strips 906, 908 that are similar to those described with reference to FIG. 6a.

Figure 9B:
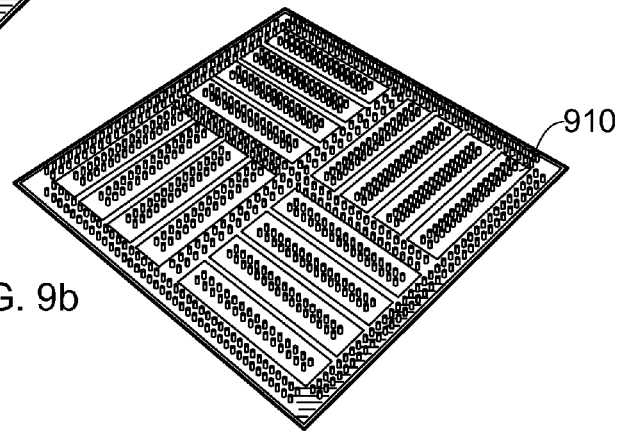

FIG. 9b illustrates the implementation of vertical connectors (which may be by multiple vias 910 as shown) to allow connection between a) the gate strips 906, 908 of FIG. 9a and the first and second anode layers located above the gate connection layer (described below with reference to FIG. 9c), and b) between the bulk around the outside of the each unit cluster in FIG. 9a and the cathode connection frame located in the gate connection layer.

Figure 9C:
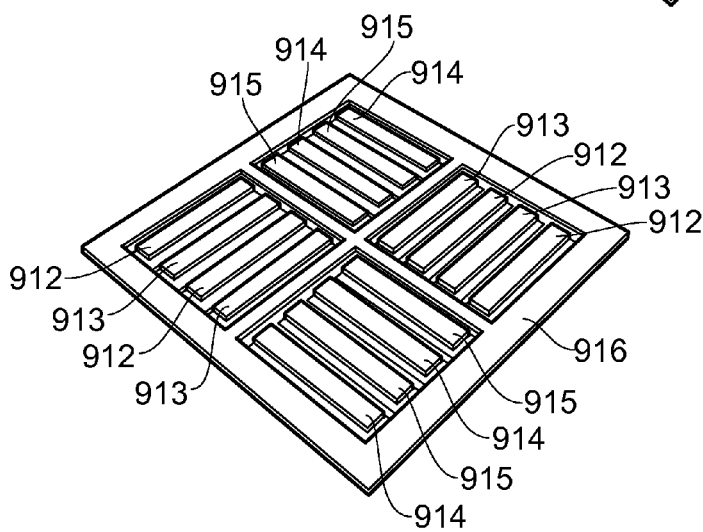

FIG. 9c illustrates the implementation of gate connection strips 912, 913, 914, 915, in the first layer of metallisation, which connect to the unit clusters 902, 904 of gate strips 906, 908 by the vias shown in FIG. 9b. The layout of the gate connection strips is similar to that described with respect to FIG. 6b.

Also shown in FIG. 9c is the cathode connection frame 916, which is in electrical contact with the corresponding vias shown in FIG. 9b.

Figure 9D:
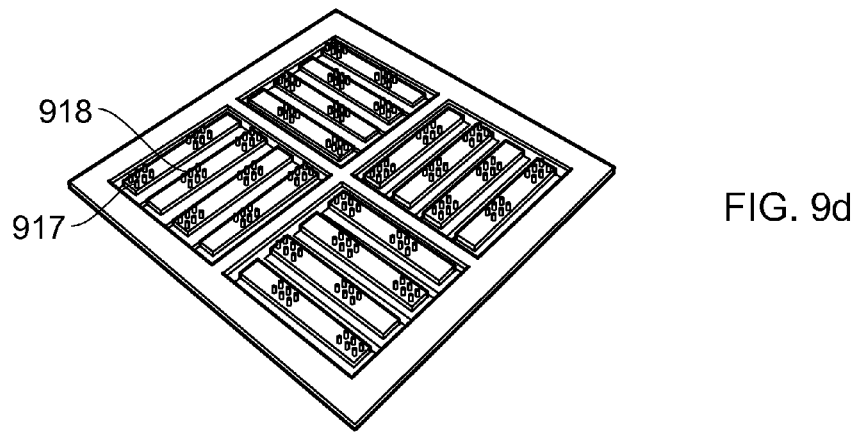

FIG. 9d illustrates the implementation of clusters of multiple vias to allow connection from the gate connection strips 912, 913, 914, 915 of FIG. 9c to the first and second anode layers that will be described with reference to FIGS. 9e and 9g. Each connection point 917, 918 in this example comprises a cluster of six vias 917, 918. The positioning of via clusters 917 on one connection strip are offset with respect to via clusters 918 of a neighbouring gate connection strip.

Figure 9E:
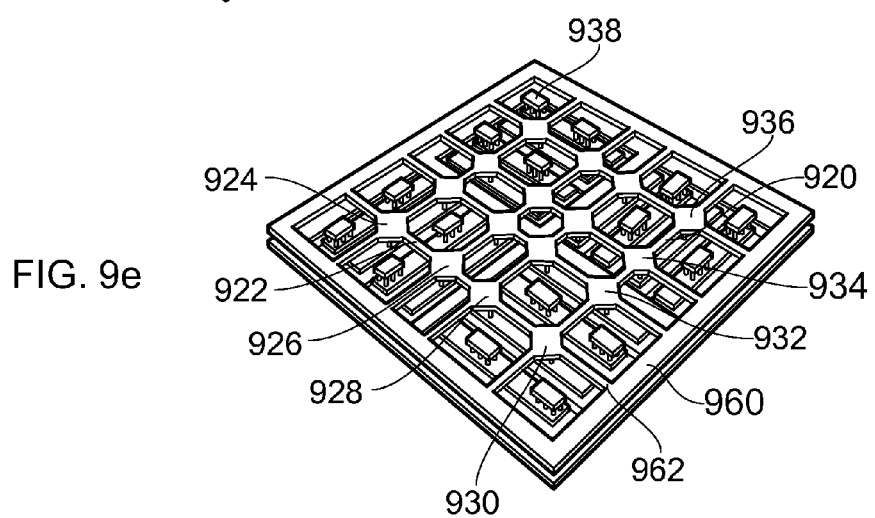

FIG. 9e illustrates the implementation of the first electrically conductive anode layer in the second layer of metallisation. As with the example of FIG. 6c, four first anode strips 920 are provided in a first direction and four second anode strips are provided in a second direction, transverse to the first direction. Connections 918 between the gate connection strips 913, 915 and the anode strips 922, 920 in this first anode layer are made by the connections 918 made in FIG. 9d.

Each anode strip 920, 922 is narrower in between the via connection points to the gate connection strips 913, 915 in the lower layer. In this way, the parasitic capacitance experienced by the anode strips 920, 922 can be reduced. In this example, the anode strips 920, 922 are wider at the via connection points 924, 926, 928, 930, 932, 934 so as to decrease the resistance of the anode strips at these locations in order to have reliable connections between layers with multiple vias and therefore improve the direct coupling to the vias.

Also shown in FIG. 9e are islands 938 of conductive material at locations that correspond to the vias 917 shown in FIG. 9d. The islands 938 are used for connecting the gate connection strips 912, 913, 914, 915 to anode strips in the second anode layer (shown in FIG. 9g).

Figure 9F:
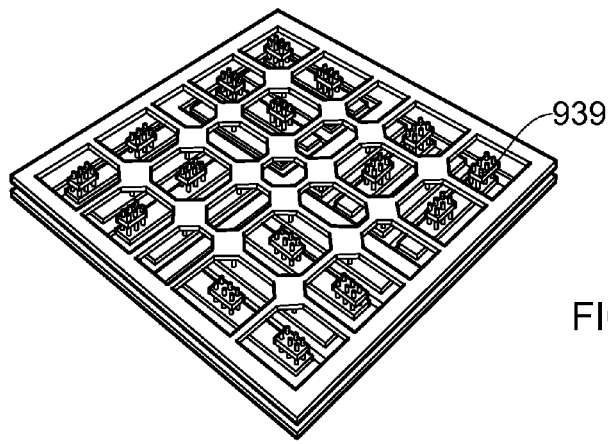

FIG. 9f illustrates the implementation of vertical connectors 939 (which in this example are clusters of six vias per connection) on the islands 938 shown in FIG. 9e. These vias 939 are used to allow connection from the gate connection strips 912, 914 to the second anode layer through the first anode layer. This build up of connections may be referred to as pillars 938.

Figure 9G:
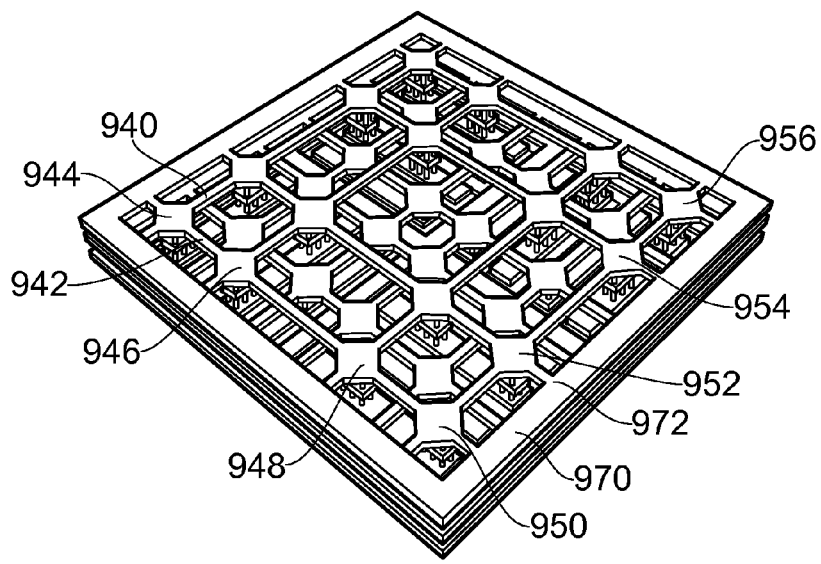

FIG. 9g illustrates the implementation of the second anode layer in the third layer of metallisation, which includes the first and second anode strips 942, 940 that are similar to those shown in FIG. 6d. The anode strips 942, 940 are electrically connected to the vias 939 shown in FIG. 9f. As with the anode strips in the first anode layer shown in FIG. 9e, the anode strips 942, 940 in the second anode layer are also narrower in between via connection points 944, 946, 948, 950.

Experimental Results

Prior to physical silicon implementation, the proposed varactor was simulated using a 3D electromagnetic (EM) simulator. A goal of this simulation was to quantify the gain in terms of electrical resistance of the interconnected part of the varactor. That is, a varactor according to an embodiment of the invention (with in-built interconnections for other components) is compared with a prior art varactor with interconnections in order to compare like with like. These simulations indicate that a significant electrical resistance reduction of 50% may be achieved using embodiments of this disclosure. Physical on-wafer measurements have been performed up to a frequency of 50 GHz to support the theoretical modelling investigations.

The "active" part of the device cannot easily be simulated as its behaviour is driven by Boltzmann equations, which are difficult to model, rather than Maxwell equations, which may be more readily modelled.

FIG. 10 illustrates a plot 1000 of the variations of the differential capacitance $C_{diff}$(fF) 1004 versus bias voltage (V) 1002 at a frequency of 5.33 GHz. It can be seen that for a bias voltage of around 2 V, a differential capacitance of around 120 fF is observed. The tuning range of the proposed varactor measured in FIG. 10 was found to be 32%, which is comparable to the tuning range observed for a connected "finger-type" varactor and for an IGV MOS varactor embedded within a 47 GHz LC VCO.

FIG. 11 shows a plot 1100 of the variations of the quality factor $Q_{diff}$ 1104 of the proposed varactor with bias voltage (v) 1102, at a frequency of 5.33 GHz, which has been extracted from physical measurements of a varactor according to embodiments disclosed herein. The measured quality factor $Q_{diff}$ at a frequency of 5.33 GHz can be seen to vary between 50 (at 0.0 V biasing) to a value of 180 (for a 4.0V biasing). This high level of quality factor (180) is clearly higher that the quality factor obtained for either a "finger-type" or an IGV type varactor. Therefore, the proposed varactor has a much improved quality factor for a similar tuning range and can thus outperform the other varactor types.

It has also been found that a varactor according to an embodiment of the invention can have a low serial resistance. This is due to, at least in part, the distributed nature of the inter-layer connections between the first and second anode layers and the gate connection layer, and from the orthogonal placement of the gate units together with the improved connection to the bulk due to a good connection from signal source to the bulk (provision of a wide rail, not at a too low level) and connection to each cluster/cell on four sides rather than two sides.

Improvements achieved by the proposed varactor are summarized in the table below.

|  | Finger-type varactor[2] | Finger-type varactor with interconnections[2] | IGV MOS varactor[1] | Proposed varactor[2] |
|---|---|---|---|---|
| TR | 36.9% | 31.9% | 29.5% | 31.6% |
| $Q_{min}$ (5 GHz) | 33 | 34 | 50 | 49 |
| $Q_{min}$ (10 GHz) | 17 | 18 | 40 | 26 |
| $Q_{min}$ (40 GHz) | 5 | 5 | 7 | 4 |
| $Q_{max}$ (5 GHz) | 84 | 95 | 91 | 174 |
| $Q_{max}$ (10 GHz) | 42 | 47 | 73 | 110 |
| $Q_{max}$ (40 GHz) | 10 | 12 | 13 | 21 |
| FOM (5 GHz) | $113 \times 10^9$ | $109 \times 10^9$ | $111 \times 10^9$ | $188 \times 10^9$ |
| FOM (10 GHz) | $107 \times 10^9$ | $103 \times 10^9$ | $167 \times 10^9$ | $215 \times 10^9$ |
| FOM (40 GHz) | $109 \times 10^9$ | $108 \times 10^9$ | $118 \times 10^9$ | $158 \times 10^9$ |

IGV MOS = Island-gate varactor, metal-oxide-semiconductor;
TR = Tuning range;
FOM = Figure of Merit
[1]This is for a 50 fF device (which inherently must have a higher Q-factor compared with a 140fF device)
[2]140 fF device From the experimental results obtained, an increase of up to 110% of the quality factor $Q_{max}$ is observed for a varactor as described herein compared with a "finger-type" and an IGV varactor design. Further, the FoM of the proposed varactor, obtained by combining the tuning range TR and the quality factor Q, does not suffer from the proposed interconnection strategy and increases by 45 to 100%. The proposed varactor layout topology also exhibits good results at a frequency of 40 GHz. Such varactors as proposed herein are therefore suitable for millimeter-wave domain applications.

Varactors as disclosed herein may advantageously be fabricated using existing processes, and no new particular masks or techniques may be required. This ensures that there is no significant increase in the cost or difficulty of manufacture of a varactor as described herein, compared with the cost of existing processes for varactor manufacture. Such varactors as disclosed herein are compliant with existing integrated circuit (IC) design rules, and measurements have already been made of such devices on silicon as described later.

It will be appreciated that although the term varactor has been used throughout this specification, such devices may also be known as varicaps, varicap diodes, varactor diodes, variable capacitance diodes, variable reactance diodes and tuning diodes.

The first and second gate units may be arranged in a square pattern, a rectangular pattern or an irregular pattern. The first and second gate units may be arranged in a pattern overall having more than four sides, such as an "L"-shaped pattern. The first and second gate units may be arranged with a central void in an open pattern, such as a "C"-shaped pattern. The first and second gate units may be arranged with a central void in an open-square or open-rectangular pattern.

The integrated circuit based varactor may comprise two first gate units and two second gate units forming a 2×2 symmetrical square integrated circuit based varactor. The integrated circuit based varactor may comprise a number of first gate units and the same number of second gate units forming, for example, a 3×3, 4×4, 5×5, 6×6, or higher symmetrical square integrated circuit based varactor. The integrated circuit based varactor may comprise a number of first gate units and a different number of second gate units forming a rectangular pattern providing, for example, a 1×2, 1×3, 2×3, 2×4, 2×5, 3×4, 3×5 or higher rectangular integrated circuit based varactor.

The varactor is comprised of a number of gate units (unit cells), which can be arranged in many different arrangements. The layout of the varactor can be scalable, which means that it can be a simple task to increase or decrease the overall size of the varactor by adding or removing gate units from the layout to scale the varactor as a whole. This modular approach to varactor construction advantageously provides the layout/circuit designer with good flexibility in the layout/circuit design when including such varactors in a circuit.

A varactor as described herein may be used in a local oscillator, and the improved quality factor and wide tuning range of the varactor advantageously provides a high performance local oscillator. Varactors disclosed herein may be used as radio frequency (RF) and mm-wave frequency synthesizers to decrease phase noise within a local oscillator, which are relevant to RF small signal high performance microwave voltage controlled oscillators (VCOs).

There exists a trade-off in layout design of varactors between achieving a wide tuning range and achieving a high device quality factor, to optimise the intrinsic performance of the varactor. Integrated circuit based varactors disclosed herein may be considered to achieve this and provide a high device quality factor with a wide tuning range.

Embodiments of the invention can provide symmetrical distributed connection (to enable convenient integration of the device, that is, same footprint) including vertical plugs/connectors on anodes. Convenient integration can be provided by realising the connection between each gate of anode1/anode2 on top of the "active" part of the device. In this way, no connection outside of the footprint of the device may be required. Therefore, the total area of the device remains the same. Furthermore this can also allow a complete connection matrix to be provided that that reduces or minimizes the parasitic serial electrical resistance. This may not be possible with non-vertical plugs/connectors, for example longitudinal connectors.

The vertical plugs/connectors on anodes can be possible due to the insertion of either metal2/metal1 connection or metal1/metal2/metal3 connection. So these vertical plugs can connect either anode1 or anode2. This can maintain the symmetry of the device, thus allowing a differential operation and provides a complete "matrix-like" connection to decrease the electrical resistance and thus increase the quality factor.

The invention claimed is:
1. An integrated circuit based varactor comprising:
 a) a substrate comprising a set of first gate units and a set of second gate units, the sets of first and second gate units each comprising a plurality of substantially parallel gate strips, the sets of first and second gate units located such that the gate strips of the set of first gate units are oriented transverse to the gate strips of the set of second gate units;

b) an electrically conducting gate connection layer comprising:
a set of first gate connection units and a set of second gate connection units, each of the sets of first and second gate connection units comprising a plurality of substantially parallel gate connection strips; wherein the gate connection strips of the set of first gate connection units and the gate connection strips of the set of second gate connection units are located substantially over the gate strips of the sets of first and second gate units; and
a cathode connection frame located around each of the gate connection units;

c) a first electrically conductive anode layer comprising:
one or more first anode strips located substantially parallel to the gate connection strips of the set of first gate connection units;
one or more second anode strips located substantially parallel to the gate connection strips of the set of second gate connection units;
each first anode strip connected to alternate gate connection strips of the set of first gate connection units, and alternate gate connection strips of the set of second gate connection units;
each second anode strip connected to the alternate gate connection strips of the set of second gate connection units and the alternate gate connection strips of the set of first gate connection units; and
a first anode connection frame connected to the one or more first anode strips and the one or more second anode strips;

d) a second electrically conductive anode layer comprising:
one or more third anode strips located substantially parallel to the gate connection strips of the set of first gate connection units;
one or more fourth anode strips located substantially parallel to the gate connection strips of the set of second gate connection units;
each third anode strip connected to opposite alternate gate connection strips of the set of first gate connection units, and opposite alternate gate connection strips of the set of second gate connection units;
each fourth anode strip connected to the opposite alternate gate connection strips of the set of second gate connection units, the and opposite alternate gate connection strips of the set of first gate connection units; and
a second anode connection frame connected to the one or more third anode strips and the one or more fourth anode strips.

2. The integrated circuit based varactor of claim 1, wherein the plurality of substantially parallel gate strips of the set of first gate units and the plurality of substantially parallel gate strips of the set of second gate units comprise metal plates laid down over an oxide on the substrate.

3. The integrated circuit based varactor of claim 1, wherein the cathode connection frame is connected to the substrate by one or more vertical connectors.

4. The integrated circuit based varactor of claim 1, wherein the opposite alternate gate connection strips of the sets of first and second gate connection units, connected to the one or more first anode strips and the one or more second anode strips in the second electrically conductive anode layer, are oppositely alternate with respect to the alternate gate connection strips of the sets of first and second gate connection units, connected to the one or more first anode strips and the one or more second anode strips in the first electrically conductive anode layer.

5. The integrated circuit based varactor of claim 1, wherein:
each first anode strip in the first electrically conductive anode layer is connected to alternate gate connection strips of the set of first gate connection units at a plurality of regularly spaced points along each alternate gate connection strip;
each second anode strip in the first electrically conductive anode layer is connected to alternate gate connection strips of the set of second gate connection units at a plurality of regularly spaced points along each alternate gate connection strip;
each first anode strip in the second electrically conductive anode layer is connected to opposite alternate gate connection strips of the set of first gate connection units, at a plurality of regularly spaced points along each alternate gate connection strip; and
each second anode strip in the second electrically conductive anode layer is connected to opposite alternate gate connection strips of the set of second gate connection units, at a plurality of regularly spaced points along each alternate gate connection strip.

6. The integrated circuit based varactor of claim 1, wherein:
the one or more first anode strips and the one or more second anode strips in the first electrically conductive anode layer are each connected at each end to the first anode connection frame; and
the one or more first anode strips and the one or more second anode strips in the second electrically conductive anode layer are each connected at each end to the second anode connection frame.

7. The integrated circuit based varactor of claim 1, wherein the first anode connection frame and the second anode connection frame are exposed on a side surface of the integrated circuit based varactor for electrical connection to other components in the same integrated package.

8. The integrated circuit based varactor of claim 1, wherein:
the first and second anode strips in the first electrically conductive anode layer are wider at regions of connection to the alternate gate connection strips of the sets of first and second gate connection units than the between the regions of connection; and
the first and second anode strips in the second electrically conductive anode layer are wider at regions of connection to the opposite alternate gate connection strips of the sets of first and second gate connection units than between the regions of connection.

9. The integrated circuit based varactor of claim 1, wherein:
the connections between first and second anode strips in the first electrically conductive anode layer to the alternate gate connection strips of the sets of first and second gate connection units; and
the connections between the first and second anode strips in the second electrically conductive anode layer to the opposite alternate gate connection strips of the sets of first and second gate connection units;
comprise multiple via connections.

10. The integrated circuit based varactor of claim 1, wherein the first and second gate units are arranged in a rectangular pattern.

11. The integrated circuit based varactor of claim 1, further comprising:
a first dielectric layer located between the gate connection layer and the first electrically conductive anode layer, and
a second dielectric layer located between the first electrically conductive anode layer and the second electrically conductive anode layer.

12. An oscillator comprising the integrated circuit based varactor of claim 1.

* * * * *